United States Patent
Chang

(10) Patent No.: US 8,994,387 B2
(45) Date of Patent: Mar. 31, 2015

(54) SEMICONDUCTOR DEVICE AND DETECTION METHOD THEREOF

(71) Applicant: Winbond Electronics Corp., Taichung (TW)

(72) Inventor: Chih-Hsiang Chang, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 383 days.

(21) Appl. No.: 13/668,308

(22) Filed: Nov. 4, 2012

(65) Prior Publication Data

US 2014/0125362 A1 May 8, 2014

(51) Int. Cl.
  *G01R 27/02* (2006.01)
  *G01R 17/02* (2006.01)
  *G01R 31/317* (2006.01)
  *G01R 31/28* (2006.01)

(52) U.S. Cl.
  CPC ...... *G01R 31/31713* (2013.01); *G01R 31/2853* (2013.01)
  USPC .......................................... 324/705; 324/691

(58) Field of Classification Search
  USPC ..................... 324/705, 691; 438/14
  See application file for complete search history.

(56) References Cited

U.S. PATENT DOCUMENTS

| 2003/0048665 | A1* | 3/2003 | Thomsen et al. ........ 365/185.25 |
| 2011/0115509 | A1 | 5/2011 | Kim et al. |
| 2012/0074924 | A1 | 3/2012 | Dequina et al. |
| 2012/0099345 | A1 | 4/2012 | Zhao et al. |

FOREIGN PATENT DOCUMENTS

| TW | 200702729 | 1/2007 |
| TW | 201220775 | 5/2012 |
| TW | 201223319 | 6/2012 |

OTHER PUBLICATIONS

"Office Action of Taiwan Counterpart Application", issued on Feb. 21, 2014, p. 1-p. 3.

* cited by examiner

*Primary Examiner* — Vincent Q Nguyen
(74) *Attorney, Agent, or Firm* — Jianq Chyun IP Office

(57) ABSTRACT

A semiconductor device and a detection method thereof are provided. The semiconductor device includes a resistor terminal, a dummy pull up driver, a comparator and a detection state machine. The resistor terminal is connected to an external resistor. The dummy pull up driver provides driving operations of $2^0$ to $2^{N+1}-1$ stages, wherein N is a natural number. The comparator outputs a comparison signal in response to a test voltage and a reference voltage. The detection state machine controls the driving operation of the dummy pull up driver to generate and output a detection signal according to the comparison signal. The detection signal indicates an electric connection state of the resistor terminal is a connecting state of an operation voltage or a floating state, a connecting state of the external resistor, or a connecting state of a ground voltage.

13 Claims, 4 Drawing Sheets

SEMICONDUCTOR DEVICE AND DETECTION METHOD THEREOF

TECHNICAL FIELD

The invention relates to a semiconductor device and a detection method thereof, and more particularly, to a semiconductor device and a detection method thereof for detecting an electric connection state of a resistor terminal.

BACKGROUND

Semiconductor devices having a resistor terminal (such as a dynamic memory device) require to detect whether the resistor terminal is coupled to an external resistor. Generally, a detection mechanism of semiconductor devices is capable of distinguishing whether the external resistor exists, but it is not considered the circumstances if connecting to the external resistor or not. Currently, under the circumstances without connecting to the external resistor, there is no available mechanism to detect whether the resistor terminal is coupled to an operation voltage, a ground voltage, or a floating.

SUMMARY

Accordingly, the invention is directed to a semiconductor device and a detection method thereof, so as to solve the issues/problems mentioned in the related art.

The invention provides a semiconductor device, which includes a resistor terminal, a dummy pull up driver, a comparator and a detection state machine. The resistor terminal is configured to connect to an external resistor. The dummy pull up driver is coupled to an operation voltage and the resistor terminal. The dummy pull up driver provides driving operations of $2^0$ to $2^{N+1}-1$ stages, where N is a natural number. The comparator outputs a comparison signal in response to a test voltage and a reference voltage. The test voltage is generated at a coupling contact of the resistor terminal and the dummy pull up driver. The detection state machine is coupled to an output terminal of the comparator and the dummy pull up driver. The detection state machine controls the driving operation of the dummy pull up driver to generate and output a detection signal according to the comparison signal. The detection signal may be configured to indicate an electric connection state of the resistor terminal is a connecting state of the operation voltage or a floating state, a connecting state of the external resistor, or a connecting state of a ground voltage.

The invention further provides a detection method of a semiconductor device, for detecting an electric connection state of a resistor terminal in the semiconductor device The detection method includes: providing a dummy pull up driver, a comparator and a detection state machine, wherein the dummy pull up driver provides driving operations of $2^0$ stage to $2^{N+1}-1$ stage, where N is a natural number, and the comparator outputs a comparison signal in response to a test voltage and a reference voltage, wherein the test voltage is generated at a coupling contact of the resistor terminal and the dummy pull up driver; and controlling the driving operation of the dummy pull up driver by the detection state machine to generate and output a detection signal according to the comparison signal, wherein the detection signal is configured to indicate the electric connection state is a connecting state of an operation voltage or a floating state, a connecting state of an external resistor, or a connecting state of a ground voltage.

According to the above descriptions, the invention may distinguish whether the external resistor of the semiconductor device is coupled to the external resistor, and under the circumstances without connecting to the external resistor, the invention may also distinguish whether the electric connection state of the resistor terminal is the connecting state of the operation voltage or the floating state, or the connecting state of the ground voltage.

In order to make the features and advantages of the present invention more comprehensible, the present invention is further described in detail in the following with reference to the embodiments and the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
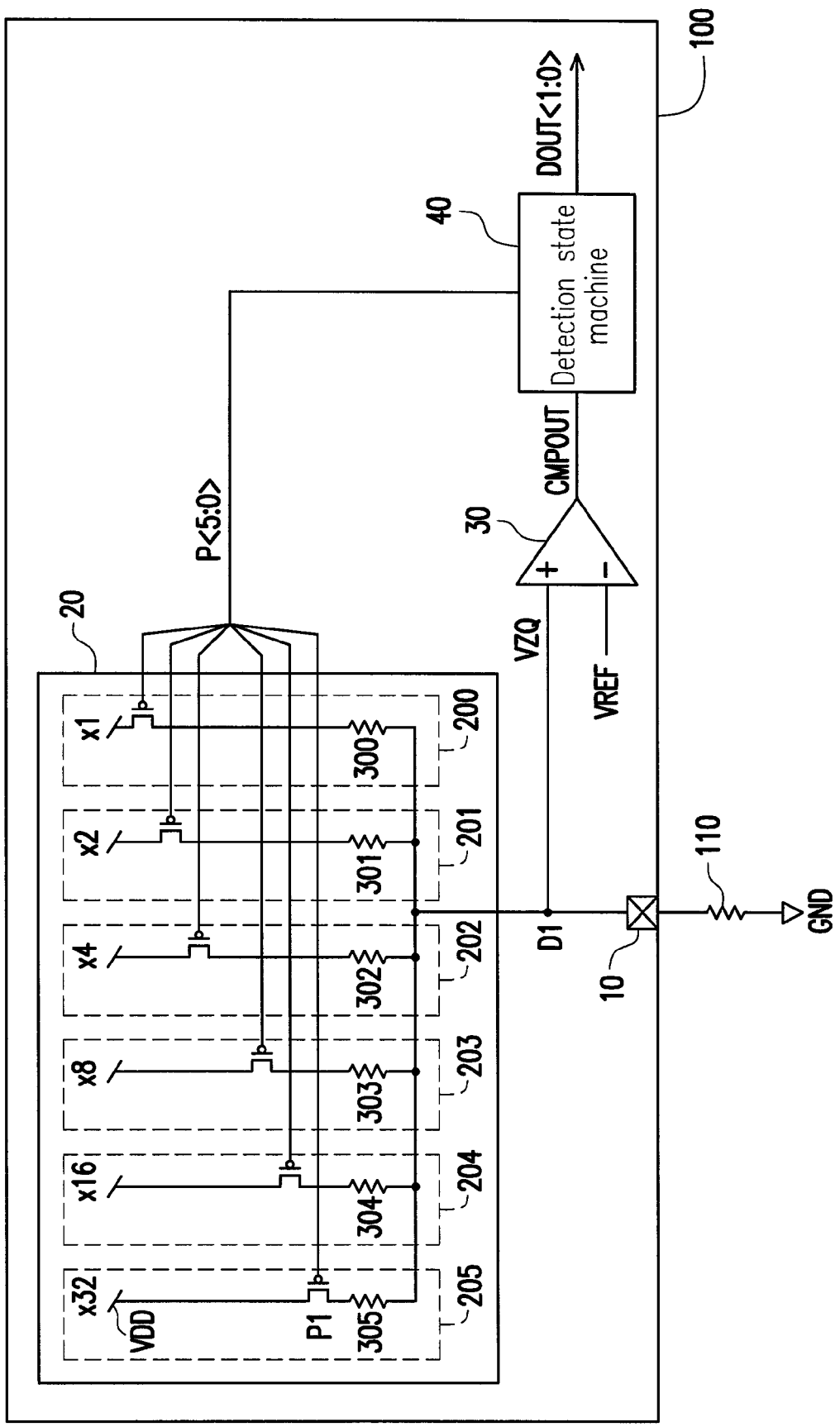
FIG. 1 is a schematic diagram illustrating a semiconductor device according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

It will be understood that when an element is referred to as being "on", "connected to", or "coupled to" another element, it can be directly on, connected, or coupled to the other element, or intervening elements may be present. In contrast, when an element is referred to as being "directly on," "directly connected to", or "directly coupled to" another element, there are no intervening elements present.

FIG. 1 is a schematic diagram illustrating a semiconductor device according to an embodiment of the invention. Referring to FIG. 1, the semiconductor device 100 includes a resistor terminal 10, a dummy pull up driver 20, a comparator 30 and a detection state machine 40. The dummy pull up driver 20 is coupled to an operation voltage VDD and the resistor terminal 10. The detection state machine 40 is coupled to an output terminal of the comparator 30 and the dummy pull up driver 20. The resistor terminal 10 may be configured to connect to an external resistor 110. A coupling contact D1 of the resistor terminal 10 and the dummy pull up driver 20 may generate a test voltage VZQ. A positive input terminal of the comparator 30 is coupled to the test voltage VZQ, and a negative input terminal of the comparator 30 is coupled to a reference voltage VREF. The value of the reference voltage VREF may be half of the operation voltage VDD.

The dummy pull up driver 20 includes a plurality of driving units 200~205, and each of the driving units includes a metal-oxide semiconductor transistor and/or a resistor. For example, in the driving unit 205, a first terminal of the metal-oxide semiconductor transistor P1 is coupled to the operation voltage VDD, and a control terminal of the metal-oxide semiconductor transistor P1 receives a control signal P<5:0> from the dummy pull up driver 20. In addition, a second terminal of the metal-oxide semiconductor transistor P1 may also be coupled to a resistor 303. It should be noted that, the metal-oxide semiconductor transistor P1 in the driving unit 205 is implemented by P-type metal-oxide semiconductor (MOS) transistor, however, those skilled in the art should understand that the metal-oxide semiconductor transistor P1 in the driving unit 205 may also be implemented by N-type metal-oxide semiconductor (MOS) transistor, according to an actual design requirement.

In the driving units 200, 201, 202, 203, 204 and 205, the resistors 300~305 may be included or the resistors 300~305 may not be included, therefore, the existence relationship of the resistors 300~305 is dispensable.

It should be noticed that, if Ra indicates the internal resistance from the operation voltage VDD to the coupling contact D1 in the driving unit 200, similarly, Rb, Rc, Rd, Re and Rf may indicate the internal resistances in the driving units 201, 202, 203, 204 and 205, respectively. At this point, the relative relationship between each of the internal resistances is Ra≥Rb≥Rc≥Rd≥Re≥Rf.

In addition, the resistors 300~305 may be the parasitical resistance of metal wire per se.

The driving units 200, 201, 202, 203, 204 and 205 may respectively provide the driving operations of $2^0$ stage (×1), $2^1$ stage (×2), $2^2$ stage (×4), $2^3$ stage (×8), $2^4$ stage (×16) and $2^5$ stage (×32). Namely, the dummy pull up driver 20 may provide the driving operations of $2^0$ stage to $2^{N+1}-1$ stage, here, N is 5 (as the natural number). It should be noted that, the number of driving units is not limited to the embodiment of the invention.

Figure 2:
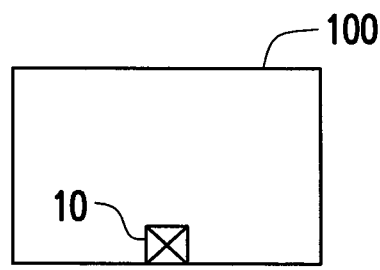
FIG. 2 through FIG. 4 are schematic diagrams illustrating an electric connection state according to an embodiment of the invention.
Figure 3:
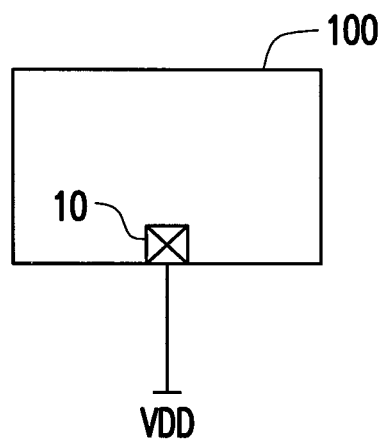
Figure 4:
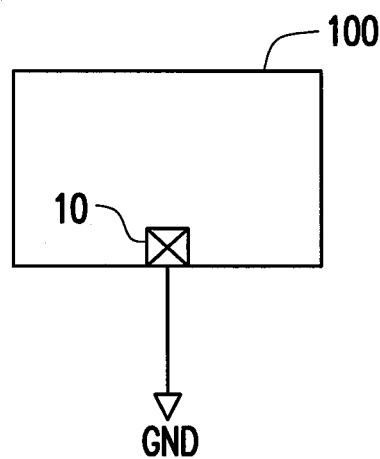

The electric connection state of the resistor terminal 10 in the semiconductor device 100 may be the connecting state of the external resistor 110, as shown in FIG. 1. It may also be the floating state as shown in FIG. 2. It may also be the connecting state of the operation voltage VDD as shown in FIG. 3. It may also be the connecting state of a ground voltage GND as shown in FIG. 4. The detection mechanism relating to the detection state machine 40 will be described in detail below.

Figure 5:
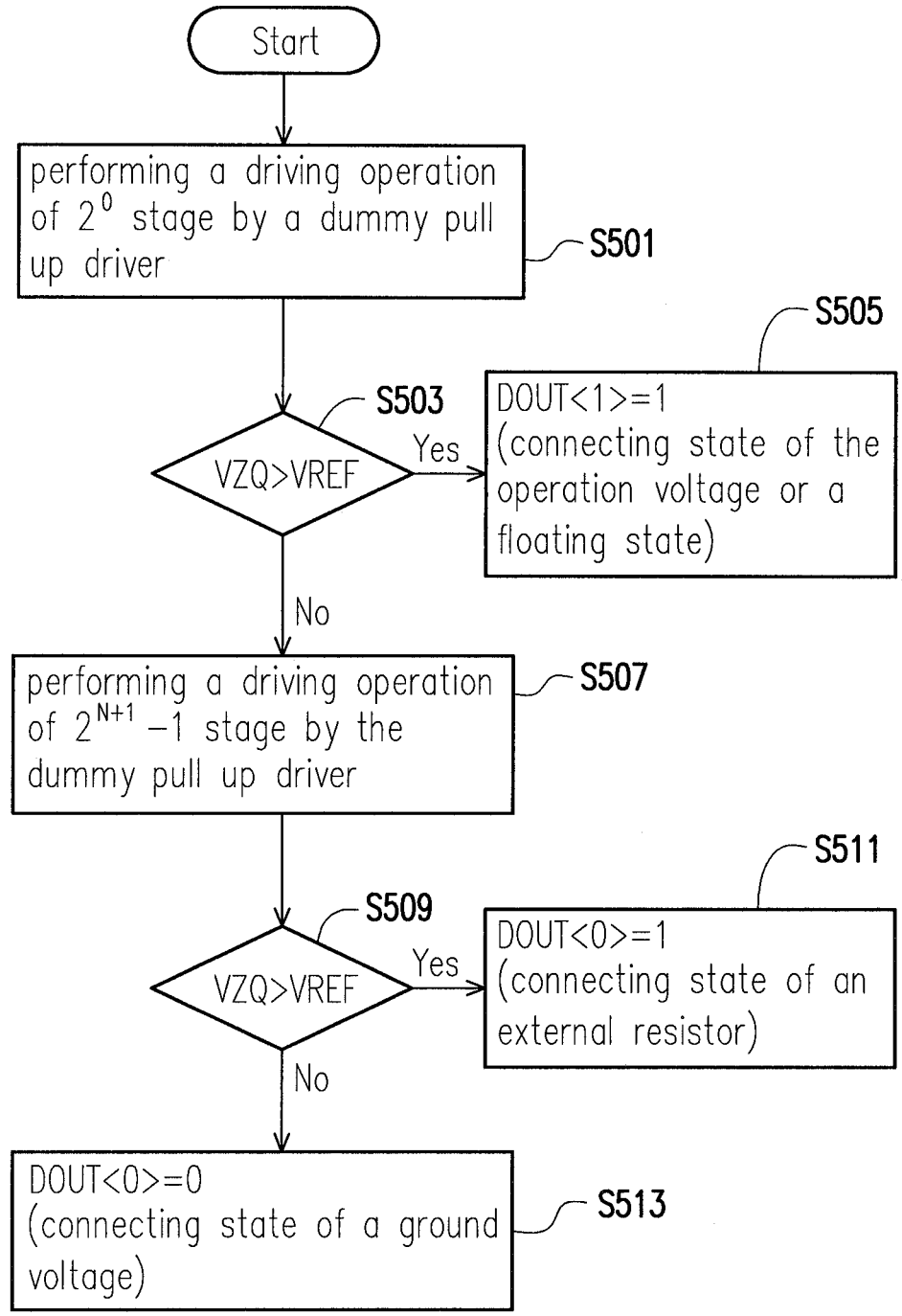
FIG. 5 is a flow chart illustrating a detection method of a semiconductor device in FIG. 1.

FIG. 5 is a flow chart illustrating a detection method of a semiconductor device in FIG. 1. Referring FIG. 1 and FIG. 5 together, the detection state machine 40 may output the control signal P<5:0> to control the driving operation of the dummy pull up driver 20. When the driving operation of the dummy pull up driver 20 is performed, the test voltage VZQ reacts to the voltage variation and/or the voltage ratio between the resistor terminal 10 and the dummy pull up driver 20.

As shown in step S501, the detection state machine 40 outputs the control signal (P<5:0>=111110) to control the driving operation of the dummy pull up driver 20, such that the dummy pull up driver 20 performs the driving operation of $2^0$ stage (×1). Since only the driver of $2^0$ stage is turned on and the drivers of other stages are turned off, the driving ability is weakest.

Next, as shown in step S503, if a comparison signal CMPOUT received by the detection state machine 40 indicates that the test voltage VZQ is greater than the reference voltage VREF, it goes to step S505, where the detection state machine 40 distinguishes the electric connection state is either the connecting state of the operation voltage VDD or the floating state, and outputs a detection signal (DOUT<1>=1). If not, it goes to step S507.

As shown in step S507, the detection state machine 40 outputs the control signal (P<5:0>=000000) to control the driving operation of the dummy pull up driver 20. such that dummy pull up driver 20 performs the driving operation of $2^{N+1}-1$ stage (×63). Since the metal-oxide semiconductor transistors in the drivers of each stage are all turned on, the driving ability is the strongest.

Next, as shown in step S509, if the comparison signal CMPOUT received by the detection state machine 40 indicates that the test voltage VZQ is greater than the reference voltage VREF, it goes to step S511, where the detection state machine 40 distinguishes the electric connection state is the connecting state of the external resistor 110, and outputs the detection signal (DOUT<0>=1). If not, it goes to step S513, where the detection state machine 40 distinguishes the electric connection state is the connecting state of the ground voltage GND, and outputs the detection signal (DOUT<0>=0).

According to the above steps (step S501 through step S513), the detection state machine 40 is applied to the loop procedure twice, before confirming the connecting state of the external resistor. The driving ability of the dummy pull up driver is set to be the weakest in the first loop procedure, and the driving ability of the dummy pull up driver is set to be the strongest in the second loop procedure. After step S501 through step S513 are summarised, the detection mechanism is shown in Table 1.

TABLE 1

| Setting the driving ability of the dummy pull up driver to be the weakest | Setting the driving ability of the dummy pull up driver to be the strongest | |
|---|---|---|
| First comparison signal CMPOUT | Second comparison signal CMPOUT | Distinguish the electric connection state |
| H | Don't care | the connecting state of the operation voltage VDD or the floating state |
| L | L | the connecting state of the ground voltage GND |
| L | H | the connecting state of the external resistor |

Figure 6:
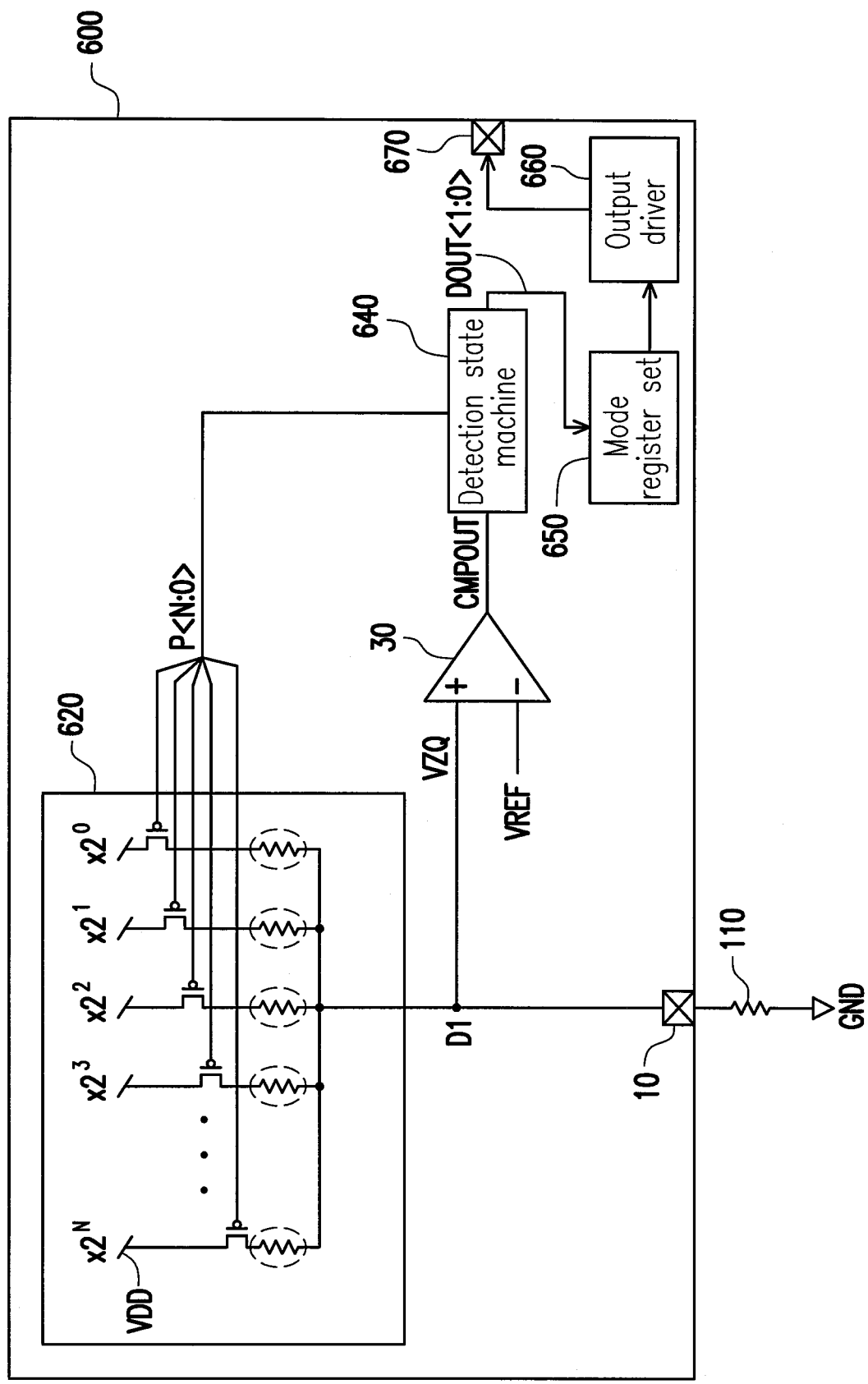
FIG. 6 is a schematic diagram illustrating a semiconductor device according to another embodiment of the invention.

FIG. 6 is a schematic diagram illustrating a semiconductor device according to another embodiment of the invention. Referring to FIG. 6, the semiconductor device 600 is similar to the semiconductor device 100 in FIG. 1. The dummy pull up driver 620 is capable of increasing the number of driving units, wherein the dotted circles in the figure indicate that the resistors may be applied or the resistors may not be applied. As shown in FIG. 6, there are N driving units, so that the driving operations of $2^0$ stage to $2^{N+1}-1$ stage may be provided, wherein N here may be a natural number that is greater than 3. Accordingly, the detection state machine 640 may output the control signal <N:0> to control the driving operation of the dummy pull up driver 620.

The semiconductor device 600 may further include a mode register set 650, an output driver 660 and an input/output terminal (I/O terminal) 670. The mode register set 650 is coupled to the detection state machine 640, and the output driver 660 is coupled between the mode register set 650 and the input/output terminal 670. The detection state machine 640 may store the detection signal DOUT to the mode register set 650. Moreover, the detection signal DOUT stored in the mode register set 650 may be outputted externally by the driving ability of the output driver 660 via the input/output terminal 670.

According to the above descriptions, in the embodiments of the invention, the driving ability of the dummy pull up driver is set through performing the loop procedures twice. In this way, the invention may distinguish whether the resistor terminal of the semiconductor device is coupled to the external resistor, and under the circumstances without connecting to the external resistor, the invention may further distinguish whether the electric connection state of the resistor terminal is the connecting state of the operation voltage or the floating state, or the connecting state of the ground voltage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a resistor terminal, configured to connect to an external resistor;
   a dummy pull up driver, coupled to an operation voltage and the resistor terminal, wherein the dummy pull up driver provides driving operations of $2^0$ stage to $2^{N+1}-1$ stage, where N is a natural number;
   a comparator, outputting a comparison signal in response to a test voltage and a reference voltage, wherein the test voltage is generated at a coupling contact of the resistor terminal and the dummy pull up driver; and
   a detection state machine, coupled to an output terminal of the comparator and the dummy pull up driver, wherein the detection state machine controls the driving operation of the dummy pull up driver to generate and output a detection signal according to the comparison signal, and the detection signal is configured to indicate an electric connection state of the resistor terminal is a connecting state of the operation voltage or a floating state, a connecting state of the external resistor, or a connecting state of a ground voltage.

2. The semiconductor device as claimed in claim 1, wherein the dummy pull up driver comprises a plurality of driving units, and each of the driving units comprises:
   a metal-oxide semiconductor transistor, having a first terminal coupled to the operation voltage and a control terminal receiving a control signal from the dummy pull up driver.

3. The semiconductor device as claimed in claim 1, wherein each of the driving units further comprises a resistor, where the resistor is coupled to a second terminal of the metal-oxide semiconductor transistor.

4. The semiconductor device as claimed in claim 1, wherein the detection state machine controls the dummy pull up driver to perform a driving operation of $2^0$ stage when detecting the electric connection state, and if the comparison signal received by the detection state machine indicates that the test voltage is greater than the reference voltage, the detection state machine distinguishes the electric connection state is either the connecting state of the operation voltage or the floating state.

5. The semiconductor device as claimed in claim 4, wherein after the detection state machine controlled the dummy pull up driver to perform the driving operation of $2^0$ stage and being informed that the test voltage is less than the reference voltage, the detection state machine controls the dummy pull up driver to change to perform a driving operation of $2^{N+1}-1$ stage, and subsequently the detection state machine receives the comparison signal, where if the subsequent comparison signal indicates that the test voltage is greater than the reference voltage, the detection state machine distinguishes the electric connection state is the connecting state of the external resistor, and if not, the electric connection state is the connecting state of the ground voltage.

6. The semiconductor device as claimed in claim 1, further comprising:
   a mode register set, coupled to the detection state machine, where the mode register set is configured to store the detection signal.

7. The semiconductor device as claimed in claim 6, further comprising:
   an output driver, coupled to the mode register set; and
   an input/output terminal, coupled to the output driver, wherein the detection signal stored in the mode register set is outputted externally by the driving ability of the output driver via the input/output terminal.

8. A detection method of a semiconductor device, for detecting an electric connection state of a resistor terminal in the semiconductor device, the detection method comprising:
   providing a dummy pull up driver, a comparator and a detection state machine, wherein the dummy pull up driver provides driving operations of $2^0$ stage to $2^{N+1}-1$ stage, where N is a natural number, and the comparator outputs a comparison signal in response to a test voltage and a reference voltage, wherein the test voltage is generated at a coupling contact of the resistor terminal and the dummy pull up driver; and
   controlling the driving operation of the dummy pull up driver by the detection state machine to generate and output a detection signal according to the comparison signal, wherein the detection signal is configured to indicate the electric connection state is a connecting state of an operation voltage or a floating state, a connecting state of an external resistor, or a connecting state of a ground voltage.

9. The detection method of the semiconductor device as claimed in claim 8, wherein the step of controlling the driving operation of the dummy pull up driver by the detection state machine comprise:
   controlling the dummy pull up driver to perform the driving operation of $2^0$ stage, and distinguishing the electric connection state to be the connecting state of the operation voltage or the floating state, if the comparison signal received by the detection state machine indicates that the test voltage is greater than the reference voltage.

10. The detection method of the semiconductor device as claimed in claim 9, further comprising:
    controlling the dummy pull up driver by the detection state machine to change to perform a driving operation of $2^{N+1}-1$ stage, after the detection state machine controlled the dummy pull up driver to perform the driving operation of $2^0$ stage and being informed that the test voltage is less than the reference voltage, and subsequently receiving the comparison signal by the detection state machine, where distinguishing the electric connection state is the connecting state of the external resistor if the subsequent comparison signal indicates that the test voltage is greater than the reference voltage, and if not, the electric connection state is the connecting state of the ground voltage.

11. The detection method of the semiconductor device as claimed in claim 8, wherein the dummy pull up driver is coupled to an operation voltage.

12. The detection method of the semiconductor device as claimed in claim 8, further comprising:
    storing the detection signal to a mode register set.

13. The detection method of the semiconductor device as claimed in claim 8, wherein the semiconductor device further comprises an output driver and an input/output terminal, where the detection signal stored in the mode register set is outputted externally by the driving ability of the output driver via the input/output terminal.

* * * * *